United States Patent
Chiu et al.

(10) Patent No.: US 9,564,330 B2
(45) Date of Patent: Feb. 7, 2017

(54) NORMALLY-OFF ENHANCEMENT-MODE MISFET

(71) Applicant: Taiwan Semiconductor Manufacturing Co., Ltd., Hsin-Chu (TW)

(72) Inventors: Han-Chin Chiu, Kaohsiung (TW); Hsing-Lien Lin, Hsin-Chu (TW); Cheng-Yuan Tsai, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/956,834

(22) Filed: Aug. 1, 2013

(65) Prior Publication Data
US 2015/0034957 A1    Feb. 5, 2015

(51) Int. Cl.
*H01L 29/20* (2006.01)
*H01L 21/28* (2006.01)
*H01L 29/778* (2006.01)
*H01L 29/66* (2006.01)

(52) U.S. Cl.
CPC ..... *H01L 21/28264* (2013.01); *H01L 29/7787* (2013.01); *H01L 29/2003* (2013.01); *H01L 29/66462* (2013.01)

(58) Field of Classification Search
CPC ........................ H01L 29/7786; H01L 29/66431
USPC .......................................................... 257/76
See application file for complete search history.

(56) References Cited

U.S. PATENT DOCUMENTS

| | | | | |
|---|---|---|---|---|
| 7,632,726 | B2 * | 12/2009 | Heying et al. | 438/167 |
| 2005/0233598 | A1 * | 10/2005 | Jung | C23C 16/402 438/785 |
| 2007/0018199 | A1 * | 1/2007 | Sheppard | H01L 29/42316 257/200 |
| 2008/0284022 | A1 * | 11/2008 | Ehara | 257/751 |
| 2011/0121313 | A1 * | 5/2011 | Briere | H01L 29/2003 257/76 |
| 2012/0146728 | A1 * | 6/2012 | Makiyama | H01L 29/66462 330/277 |

(Continued)

OTHER PUBLICATIONS

Park, et al. "Effects of plasma nitridation of Al2O3 interlayer on thermal stability, fixed charge density, and interfacial trap states of HfO2 gate dielectric films grown by atomic layer deposition." AIP Journal of Applied Physics. Aug. 1, 2003. 7 Pages.

(Continued)

*Primary Examiner* — Trang Tran
(74) *Attorney, Agent, or Firm* — Eschweiler & Associates, LLC

(57) ABSTRACT

The present disclosure relates to an enhancement mode MISFET device. In some embodiments, the MISFET device has an electron supply layer located on top of a layer of semiconductor material. A multi-dielectric layer, having two or more stacked dielectric materials sharing an interface having negative fixed charges, is disposed above the electron supply layer. A metal gate structure is disposed above the multi-dielectric layer, such that the metal gate structure is separated from the electron supply layer by the multi-dielectric layer. The multi-dielectric layer provides fixed charges at interfaces between the separate dielectric materials, which cause the transistor device to achieve a normally off disposition.

20 Claims, 7 Drawing Sheets

(56) References Cited

U.S. PATENT DOCUMENTS

2012/0161153 A1\* 6/2012 Yumoto .............. H01L 29/4236
    257/76
2013/0075789 A1\* 3/2013 Kanamura ........ H01L 29/42364
    257/194

OTHER PUBLICATIONS

Watanabe, et al. "Impact of Stacked AlON/SiO2 Gate Dielectrics for SiC Power Devices." ECS Trans. Published in 2011, vol. 35, Issue 2, pp. 265-274. 11 Pages.
U.S. Appl. No. 13/769,785, filed Feb. 18, 2013.

\* cited by examiner

NORMALLY-OFF ENHANCEMENT-MODE MISFET

BACKGROUND

Silicon based semiconductor devices have been a standard of the integrated chip industry for the past three decades. However, in recent years semiconductor devices based on alternative semiconductor materials, which offer advantages over traditional silicon based devices, have started to become manufacturable. Gallium Nitride (GaN) semiconductor devices are one such type of device that has emerged as an attractive alternative to silicon based devices in many areas.

GaN semiconductor devices have already found widespread use in optoelectric applications (e.g., in light emitting diodes) due to the wide band gap of GaN. GaN semiconductor devices also offer a potential advantage for use in solar cells (e.g., where GaN semiconductor devices cover a wide range of solar photons) and in high power applications (e.g., where the high electron mobility and low temperature coefficients of GaN allow it to carry large currents and support high voltages).

DETAILED DESCRIPTION

Figure 1:
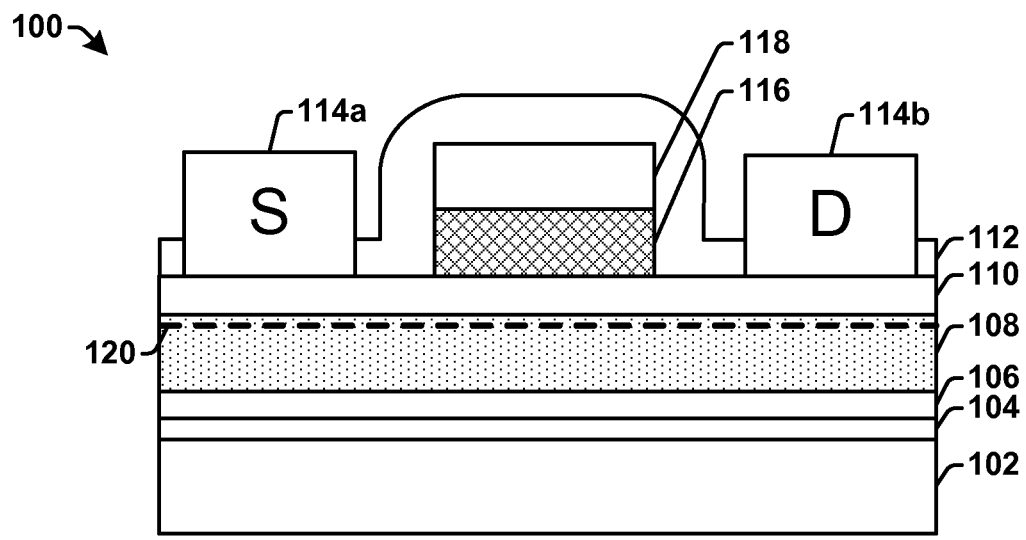
FIG. 1 illustrates a cross-sectional view of some embodiments of an enhancement mode MISFET (metal-insulator-semiconductor field-effect transistor) device.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

In recent years, Gallium nitride (GaN) transistors have emerged as a promising alternative to silicon MOSFETs for many applications (e.g., power switches). Enhancement mode GaN transistor devices operate similar to silicon MOSFET devices by normally being in a non-conductive (off) state, thereby allowing for easy integration into existing designs. However, GaN high electron mobility transistors (HEMTs) typically have a strong surface polarization that causes the GaN HEMTs to operate with normally-on (depletion-mode) status. For example, a typical GaN transistor device comprises a thin layer of aluminum gallium nitride (AlGaN), located above a GaN layer, which results in a strong surface polarization.

To overcome the surface polarization and control the flow of charge carriers in an enhancement mode device, a gate having a p-GaN material with a high work function can be formed directly on top of the AlGaN layer. However, a p-GaN gate results in a large gate leakage. Alternatively, a recessed metal gate can be formed to extend through the AlGaN layer. However, in such recessed-gate devices the channel is usually damaged, thereby reducing the mobility of the devices.

Accordingly, the present disclosure relates to an enhancement mode MISFET (metal-insulator-semiconductor field-effect transistor) or HEMT (high-electron mobility transistor) device that provides for a high-mobility and low gate leakage. In some embodiments, the enhancement mode MISFET device comprises an electron supply layer located over a layer of semiconductor material. A multi dielectric layer, comprising one or more pair of separate dielectric materials, is disposed above the electron supply layer. A metal gate structure is disposed above the multi-dielectric layer, such that the metal gate structure is separated from the electron supply layer by the multi-dielectric layer. The multi-dielectric layer provides fixed charges at interfaces between the separate dielectric materials, which mitigates surface polarization and causes the MISFET device to achieve a normally off disposition.

FIG. 1 illustrates a cross-sectional view of a first embodiment of an enhancement mode (i.e., normally off) MISFET (metal-insulator-semiconductor field-effect transistor) or HEMT (high-electron mobility transistor) device 100.

The enhancement mode MISFET device 100 comprises a layer of semiconductor material 108 disposed over a substrate 102 (e.g., a sapphire substrate, a silicon substrate, silicon carbide substrate, etc.). In some embodiments, the layer of semiconductor material 108 may comprise a III-V semiconductor material. For example, wherein the enhancement mode MISFET device 100 comprises a enhancement mode gallium-nitride transistor device, the layer of semiconductor material 108 may comprise a gallium nitride (GaN) layer (e.g., an unintentionally doped GaN layer having a doping resulting from process contaminants). In alternative embodiments, the layer of semiconductor material 108 may comprise an indium gallium nitride (InGaN) layer, for example.

In some embodiments, one or more buffer layers, 104 and 106, may be disposed between the substrate 102 and the layer of semiconductor material 108. For example, a first buffer layer 104 comprising aluminum nitride (AlN) may be disposed on the layer of semiconductor material 108, and a second buffer layer 106 comprising AlGaN may be disposed on the first buffer layer 104. The buffer layers, 104 and 106, have lattice constants that transition between a lattice constant of the substrate 102 and a lattice constant of the semiconductor material 108.

An electron supply layer 110 is located over the layer of semiconductor material 108. The electron supply layer 110 comprises a material having a band gap unequal to (e.g., larger than) that of the underlying layer of semiconductor material 108 so that a heterojunction, which serves as a channel region of the enhancement mode MISFET device 100, is located at along an interface of the layer of semiconductor material 108 and electron supply layer 110. The heterojunction causes the electron supply layer 110 to supply electrons to a two-dimensional electron gas (2-DEG) 120 located along the interface. The 2-DEG 120 has high mobility electrons that are not bound to any atom, but that are free to move between source and drain regions, 114a and 114b, of the enhancement mode MISFET device 100. In some embodiments, the electron supply layer 110 comprises aluminum gallium nitride (AlGaN). In one embodiment, the thin film of AlGaN may be intentionally doped to have a doping that provides carriers to the 2-DEG 120.

A multi-dielectric layer 116 is located over the electron supply layer 110. The multi-dielectric layer 116 comprises a negative fixed charge, which causes the transistor device to achieve a normally off disposition by mitigating surface polarization of the enhancement mode MISFET device 100. The multi-dielectric layer 116 comprises one or more groups of two or more layers of stacked dielectric materials. For example, the multi-dielectric layer 116 may comprise a first group having first and second stacked dielectric layers, and a second group overlying the first group and having the first and second stacked dielectric layers. The two or more layers of stacked dielectric materials may respectively have thicknesses in a range of between approximately 5 angstrom and approximately 200 angstrom.

Within the respective groups, a lower one of the two or more layers of dielectric material has a thermodynamically larger Gibbs free energy than an overlying one of the two or more layers of dielectric material. For example, the multi-dielectric layer 116 may comprise a group having a first dielectric layer, a second dielectric layer overlying the first dielectric layer, and a third dielectric layer overlying the second dielectric layer. The first dielectric layer has a first Gibbs free energy, which is larger than a Gibbs free energy of the second dielectric layer. The Gibbs free energy of the second dielectric layer is larger than a Gibbs free energy of the third dielectric layer. The smaller Gibbs free energy of an overlying material causes the material to be more stable than an underlying material (having a larger Gibbs free energy).

Furthermore, a lower one of the two or more layers of dielectric material within a group has a larger number of valence electrons than an overlying one of the two or more layers of dielectric material. For example, the first dielectric layer has a first number of valence electrons, which is larger than a number of valence electrons of the second dielectric layer, which is larger than a number of valence electrons of the third dielectric layer.

In some embodiments, the multi-dielectric layer 116 may comprise metal-oxide compounds, such as aluminum oxide ($Al_2O_3$) and silicon dioxide ($SiO_2$), for example. In some embodiments, the multi-dielectric layer 116 may comprise alternating layers of $Al_2O_3$ and $SiO_2$. For example, the multi-dielectric layer may comprise $Al_2O_3/SiO_2/Al_2O_3/SiO_2/\ldots Al_2O_3/SiO_2$. The $SiO_2/Al_2O_3$ pairs will generate negative fixed charges at an interface therebetween due to $Si_4+$ replacement by $Al_3+$. In some additional embodiments, the multi-dielectric layer 116 may comprise metal-nitride compounds, metal fluoride compounds, or any combination of metal-oxide, metal-nitride, and/or metal fluoride compounds.

In some embodiments, the multi-dielectric layer 116 may provide for a high barrier height with the underlying layers (e.g., a band gap larger than that of the layer of semiconductor material 108 and the electron supply layer 110), while maintaining a high channel mobility. The high-barrier height reduces gate leakage since an increased barrier height prevents thermally or photonically generated electrons from passing through the gate region.

A metal gate structure 118 is located above the multi-dielectric layer 116. In some embodiments, the metal gate structure 118 may comprise titanium (Ti). In other embodiments, the metal gate structure 118 may comprise one or more of, nickel, aluminum, or gold, for example. The multi-dielectric layer 116 separates the metal gate structure 118 from the underlying electron supply layer 110. In some embodiments, the metal gate structure 118 is disposed at a position that is in direct contact with the multi-dielectric layer 116, such that the bottom surface of the metal gate structure 118 abuts a top surface of the multi-dielectric layer 116.

A passivation layer 112 may be located over the electron supply layer 110. The passivation layer 112 is configured to protect the underlying electron supply layer 110 by mitigating surface effects responsible for degrading device performance such as, drain current degradation, larger threshold voltage (Vt) fluctuation, larger off-current leakage, etc. In some embodiments, the passivation layer 112 may comprise a silicon oxide or silicon nitride, for example.

Source and drain terminals, 114a and 114b, are located at opposite ends of the metal gate structure 118 and the multi-dielectric layer 116. During operation, the enhancement mode MISFET device 100 is turned off unless a voltage (e.g., a positive voltage) is applied to the metal gate structure 118 to drive charge carriers in the 2-DEG 120 between the source terminal 114a and the drain terminal 114b.

Figure 2:
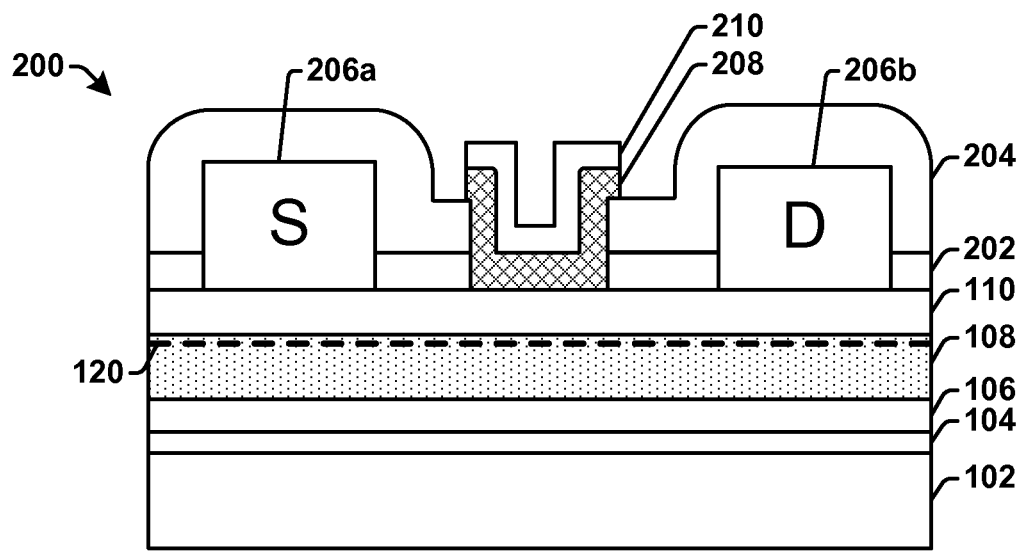
FIG. 2 illustrates a cross-sectional view of some alternative embodiments of an enhancement mode MISFET device.

FIG. 2 illustrates a cross-sectional view of some alternative embodiments of an enhancement mode MISFET device 200.

The enhancement mode MISFET device 200 comprises a layer of semiconductor material 108 (e.g., gallium nitride (GaN)) disposed over a substrate 102. In some embodiments, one or more buffer layers, 106 and 108, may be disposed between the substrate 102 and the layer of semiconductor material 108. An electron supply layer 110, located over the layer of semiconductor material 108, comprises a material having a band gap unequal to that of the underlying layer of semiconductor material 108 so that a heterojunction, which serves as a conductive channel for the enhancement mode MISFET device 200, is formed at the interface between the layer of semiconductor material 108 and electron supply layer 110.

A passivation layer 202 is disposed over the electron supply layer 110. Source and drain terminals, 114a and 114b, extend from the electron supply layer 110 through the passivation layer 202. A capping layer 204 is disposed over the passivation layer 202 and over the source and drain terminals, 114a and 114b.

A multi-dielectric layer 208, as described above, is located over the electron supply layer 110 at a position between the passivation layer 202 and the capping layer 204. The multi-dielectric layer 208, which comprises a negative fixed charge, has a U shaped structure. The U shaped structure has a cavity with steep straight sides and a substantially planar bottom.

A metal gate structure 210 is located within the cavity of the multi-dielectric layer 208. In some embodiments, the metal gate structure 210 may comprise a layer of metal gate material that conforms to the multi-dielectric layer 208 so that the metal gate structure 210 also comprises a U shaped structure.

Figure 3:
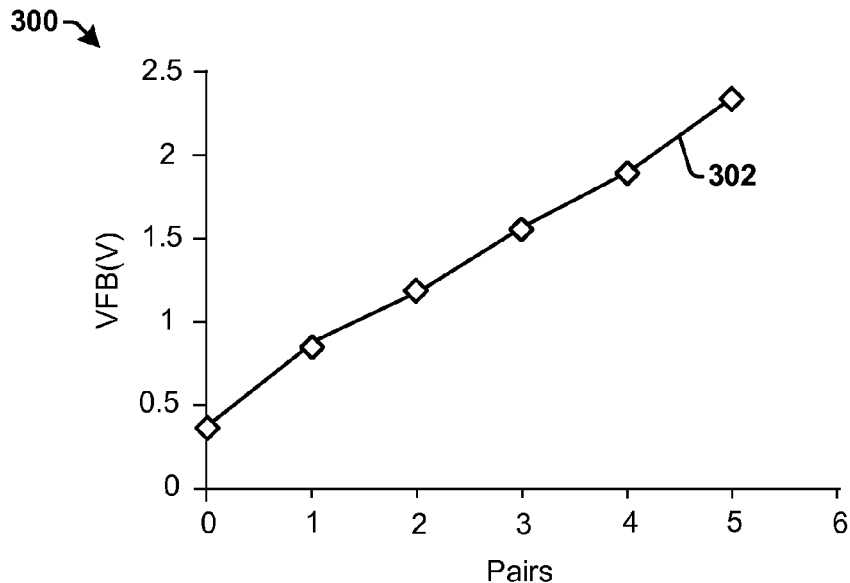
FIG. 3 illustrates some embodiments of a graph showing the fixed charges provided by a multi-dielectric layer as a function of the number of dielectric pair in the multi-dielectric layer.

It will be appreciated that the disclosed multi-dielectric layer may comprise any number of groups of dielectric materials. The number of groups used for the multi-dielectric layer provides a varying threshold voltage of an associated device. For example, FIG. 3 show a graph 300 of a flatband voltage (VFB), which is proportional to a threshold voltage, as a function of the number of dielectric pair (e.g., groups having two dielectric layers) in a multi-dielectric layer.

As shown by trendline 302 of graph 300, as the number of dielectric pair increase, the flatband voltage (VFB) provided by the multi-dielectric layer increases. For example, a single pair of dielectric materials (i.e., a first dielectric material and a second dielectric material) provides for a VFB of approximately 0.9 V, wherein three pair of dielectric materials provide for a VFB of approximately 1.5 V.

Figure 4:
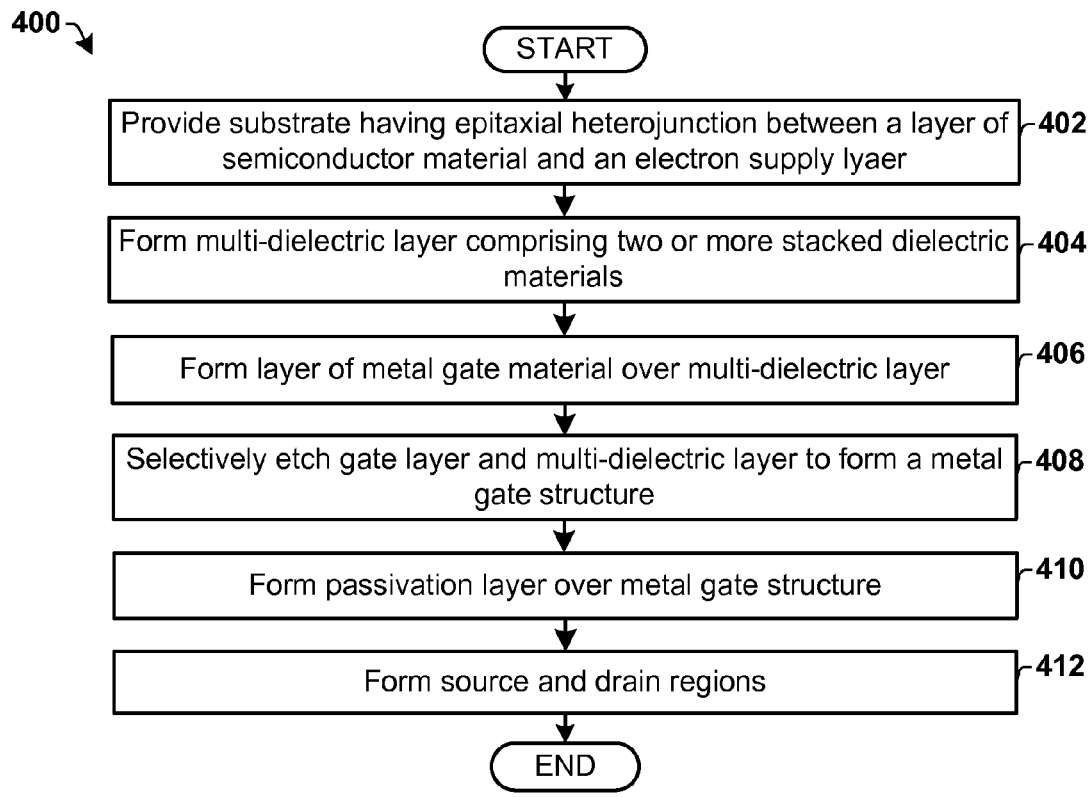
FIG. 4 illustrates a flow diagram of some embodiments of a method of forming an enhancement mode MISFET device having a multi-dielectric layer.

FIG. 4 illustrates a flow diagram of some embodiments of a method 400 for forming an enhancement mode MISFET or HEMT device having a multi-dielectric layer.

While the disclosed methods (e.g., methods 400 and 1100) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a substrate having an epitaxial heterojunction is formed. The substrate comprises a layer of semiconductor material (e.g., a III-V semiconductor material) and an overlying electron supply layer, epitaxial grown over a substrate (e.g., a sapphire substrate, a silicon substrate, silicon carbide substrate, etc.). The layer of semiconductor material and the electron supply layer have different bandgaps, resulting in the formation of a heterojunction.

At 404, a multi-dielectric layer, comprising two or more stacked dielectric materials, is formed over the electron supply layer. In some embodiments, the multi-dielectric layer comprises one or more groups, respectively comprising two or more layers of metal-oxides, metal-nitrides, and/or metal-fluorides.

At 406, a metal gate material is formed over the multi-dielectric layer. In various embodiments, the metal gate material may comprise titanium, aluminum, and/or gold, for example.

At 408, the metal gate material and the multi-dielectric layer are selectively etched to define a metal gate structure.

At 410, a passivation layer is formed over the metal gate structure.

At 412, source and drain regions are formed on opposite sides of the metal gate structure.

FIGS. 5-10 illustrates some embodiments of cross-sectional views of a substrate upon which a method forming a MISFET device, corresponding to method 400, is performed.

Figure 5:
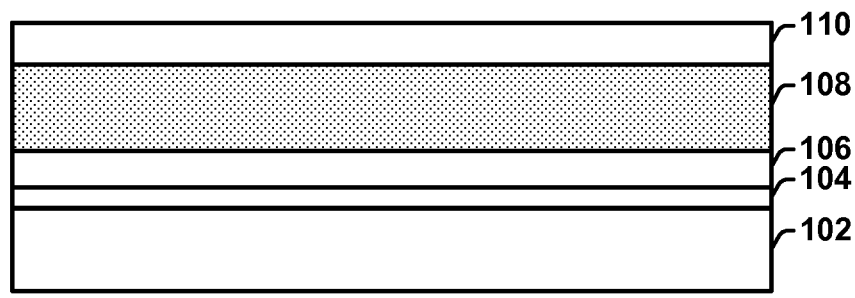
FIGS. 5-10 illustrate cross-sectional views of some embodiments of an example substrate upon which a method of forming an enhancement mode MISFET device is performed.

FIG. 5 illustrates a cross-sectional view 500 of some embodiments of a substrate corresponding to act 402. As shown in cross-sectional view 500, a plurality of epitaxial layers are formed over a substrate 102 (e.g., silicon, silicon carbide, sapphire, etc.). In various embodiments, the plurality of epitaxial layers may comprise a layer of semiconductor material 108 epitaxially grown over the substrate 102 and an electron supply layer 110 epitaxially grown over the layer of semiconductor material 108. In some embodiments, the layer of semiconductor material 108 comprises a GaN layer and the electron supply layer 110 comprises an AlGaN layer. The layer of semiconductor material 108 and the electron supply layer 110 form a heterojunction that results in a 2-dimensional electron gas (2-DEG) at an interface therebetween.

Figure 6:
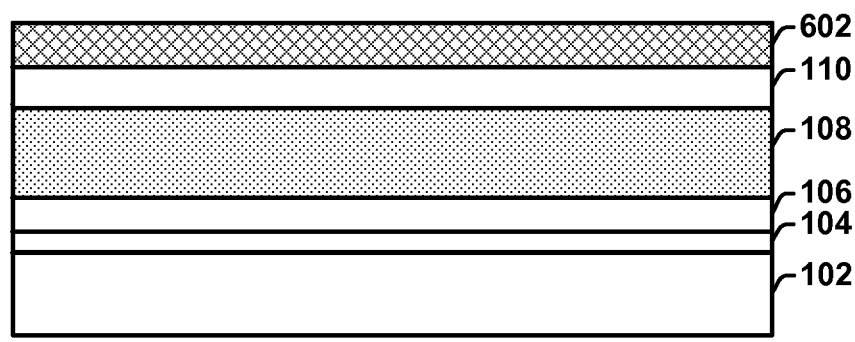

FIG. 6 illustrates a cross-sectional view 600 of some embodiments of a substrate corresponding to act 404. As shown in cross-sectional view 600, a multi-dielectric layer 602 is formed over the electron supply layer 110. The multi-dielectric layer 602 may comprise any number of pair of dielectric material, wherein each pair of dielectric material comprise an interface with high amounts of negative fixed charges. For example, in some embodiments, the multi-dielectric layer 602 may comprise groups of dielectric material, respectively comprising silicon dioxide ($SiO_2$) and aluminum oxide ($Al_2O_3$), which generate negative fixed charges at an interface therebetween.

In some embodiments, the different dielectric materials of the multi-dielectric layer 602 can be in-situ deposited using a vapor deposition technique, such as atomic layer deposition (ALD), physical vapor deposition (PVD), or chemical vapor deposition (CVD) to thicknesses in a range of between approximately 5 angstrom and approximately 200 angstrom. The use of such deposition techniques allows for control of the number of groups (e.g., pair) of dielectric material that are formed over the electron supply layer 110.

Figure 7:
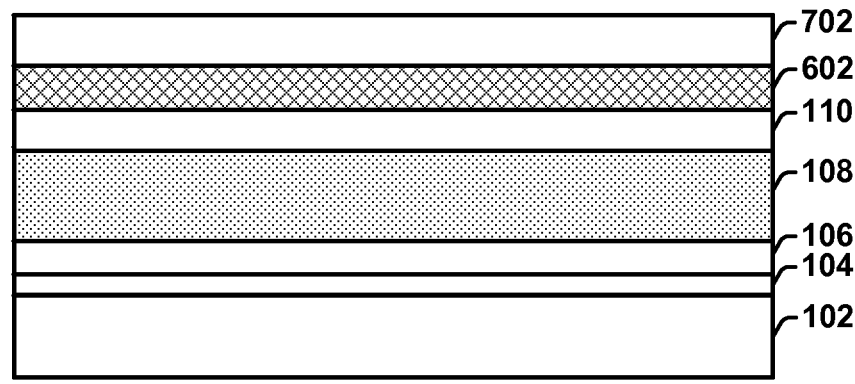

FIG. 7 illustrates a cross-sectional view 700 of some embodiments of a substrate corresponding to act 406. As shown in cross-sectional view 700, a gate metal layer 702 may be formed directly on top of the multi-dielectric layer. The gate metal layer 702 may be formed by depositing a metal (e.g., titanium) using sputtering or physical vapor deposition, for example.

Figure 8:
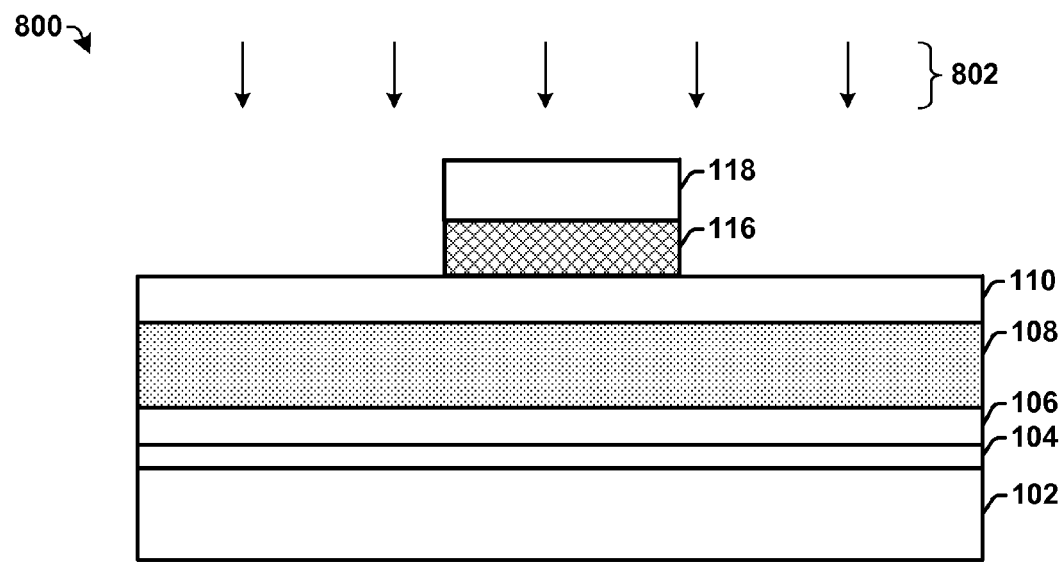

FIG. 8 illustrates a cross-sectional view 800 of some embodiments of a substrate corresponding to act 408. As shown in cross-sectional view 800, the multi-dielectric layer 602 and the gate metal layer 702 are selectively exposed to an etchant 802, which removes a part of the multi-dielectric layer 602 and the gate metal layer 702 to define a gate structure. In some embodiments, the etchant 802 may comprise a plasma etchant (e.g., an inductively coupled plasma reactive ion etchant in which high energy ions etch away the multi-dielectric layer 602 and the gate metal layer 702). For example, the etchant may be generated by a RIE plasma dry etching process performed within a low pressure etching chamber.

Figure 9:
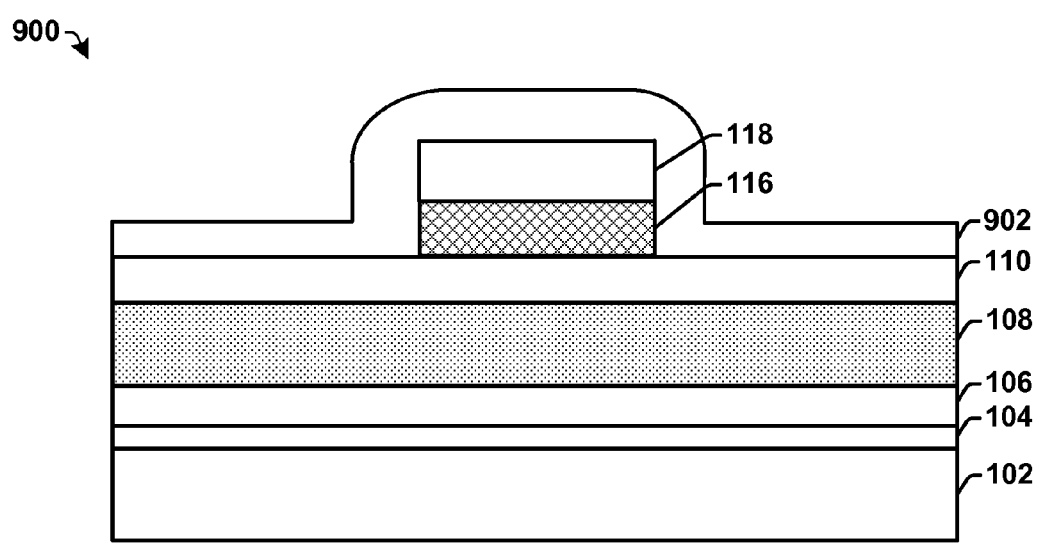

FIG. 9 illustrates a cross-sectional view 900 of some embodiments of a substrate corresponding to acts 410. As shown in cross-sectional view 900, a passivation layer 902 is formed over the substrate. The passivation layer 902 may be formed epitaxially or using a vapor deposition technique such as atomic layer deposition (ALD), chemical vapor deposition (CVD) or physical vapor deposition (PVD). In some embodiments, the passivation layer may comprise silicon nitride or silicon oxide, for example.

Figure 10:
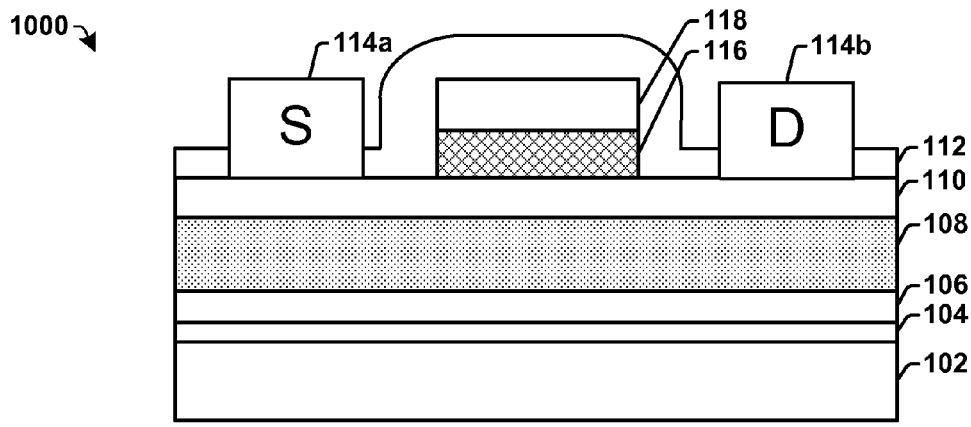

FIG. 10 illustrates a cross-sectional view 1000 of some embodiments of a substrate corresponding to acts 412. As shown in cross-sectional view 1000, source and drain regions are defined by selectively etching the passivation layer 112. Source and drain terminals, 114a and 114b, are then formed by depositing a metal within the source and drain regions.

Figure 11:
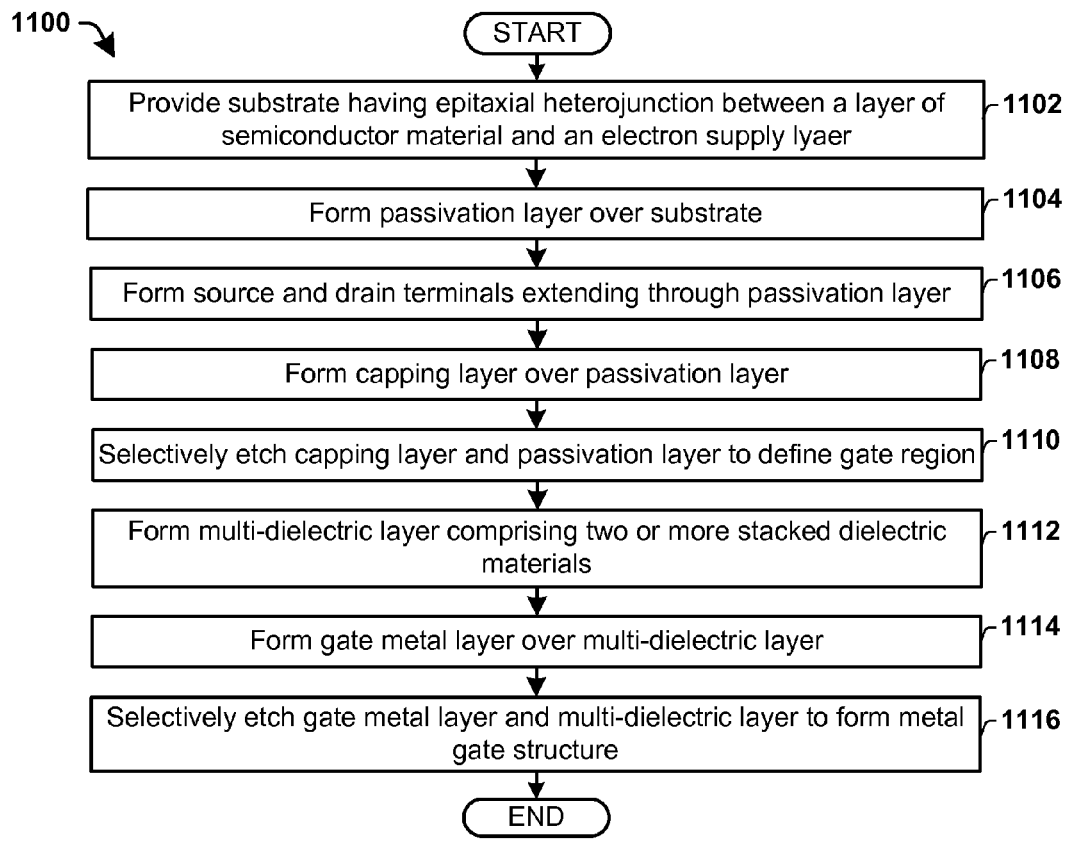
FIG. 11 illustrates a flow diagram of some embodiments of a method of forming an enhancement mode MISFET device having a multi-dielectric layer.

FIG. 11 illustrates a flow diagram of some alternative embodiments of a method 1100 for forming an enhancement mode MISFET device.

At 1102, a substrate having an epitaxial heterojunction is formed. The substrate comprises a layer of semiconductor material and an overlying electron supply layer, epitaxial grown over a substrate.

At 1104, a passivation layer is formed over the substrate.

At 1106, source and drain terminals are formed to extend through the passivation layer to the electron supply layer.

At 1108, a capping layer is formed over the source and drain terminals.

At 1110, the capping layer and the passivation layer are selectively etched to define a gate region.

At 1112, a multi-dielectric layer, comprising two or more stacked dielectric materials, is formed over the substrate. The multi-dielectric layer may be formed over the passivation layer and within the gate region.

At 1114, a gate metal layer is formed onto the multi-dielectric layer. In various embodiments, the gate metal layer may comprise titanium, aluminum or gold, for example.

At 1116, the gate metal layer and the multi-dielectric layer are selectively etched to define metal gate structure.

FIGS. 12-16 illustrate some embodiments of cross-sectional views of a substrate upon which a method forming a MISFET device, corresponding to method 1100, is performed.

Figure 12:
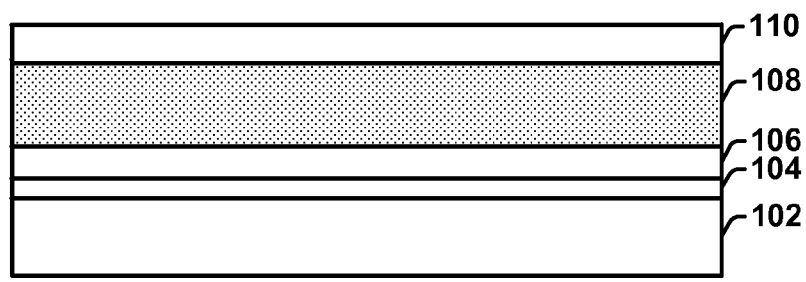
FIGS. 12-16 illustrate cross-sectional views of some embodiments of an example substrate upon which a method of forming an enhancement mode MISFET device is performed.

FIG. 12 illustrates a cross-sectional view 1200 of some embodiments of a substrate corresponding to act 1102. As shown in cross-sectional view 1200, a plurality of epitaxial layers are formed over a substrate 102 (e.g., silicon, silicon carbide, sapphire, etc.). In various embodiments, the plurality of epitaxial layers may comprise a layer of semiconductor material 108 epitaxially grown over the substrate 102 and an electron supply layer 110 epitaxially grown over the layer of semiconductor material 108.

Figure 13:
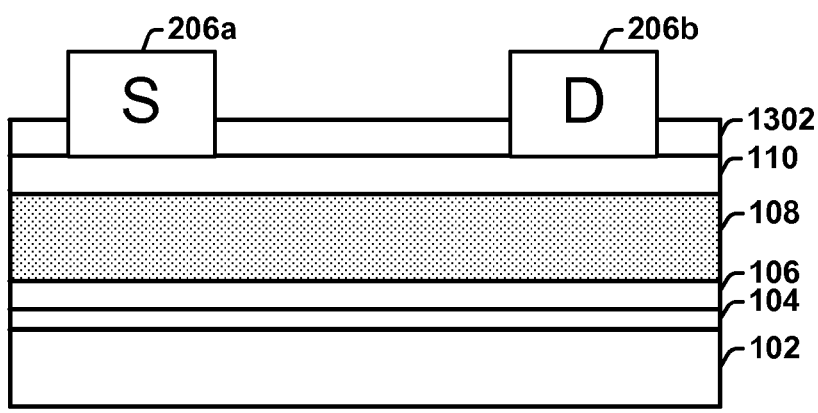

FIG. 13 illustrates a cross-sectional view 1300 of some embodiments of a substrate corresponding to acts 1104-1106. As shown in cross-sectional view 1300, a passivation layer 1302 is formed over the substrate. In some embodiments, the passivation layer 112 may comprise a silicon oxide or silicon nitride, for example. The passivation layer 1302 may be formed epitaxially or using a vapor deposition technique such as atomic layer deposition (ALD), chemical vapor deposition (CVD) or physical vapor deposition (PVD). After formation of the passivation layer 1302, source and drain terminals, 206a and 206b, are formed. The source and drain terminals, 206a and 206b, are formed by selectively etching the passivation layer 1302 to define source and drain regions within the passivation layer 1302 and then depositing source and drain metal within the source and drain regions.

Figure 14:
Figure 14:
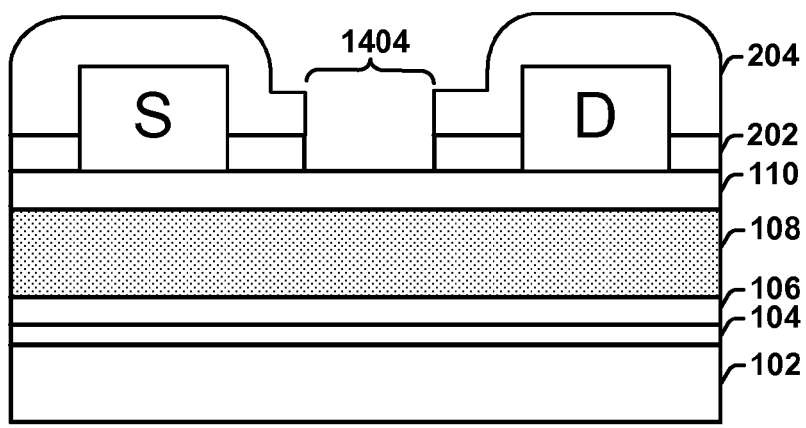

FIG. 14 illustrates a cross-sectional view 1400 of some embodiments of a substrate corresponding to acts 1108-1110. As shown in cross-sectional view 1400, a capping layer 204 is formed over the source and drain regions, 206a and 206b. In some embodiments, the capping layer 204 may comprise silicon nitride (SiN). After formation of the capping layer 204, the passivation layer 202 and the capping layer 204 are selectively exposed to an etchant 1402, which removes a part of the passivation layer 202 and the capping layer 204 to define a gate region 1404. In various embodiments, the etchant 1402 may comprise a wet or dry etchant.

Figure 15:
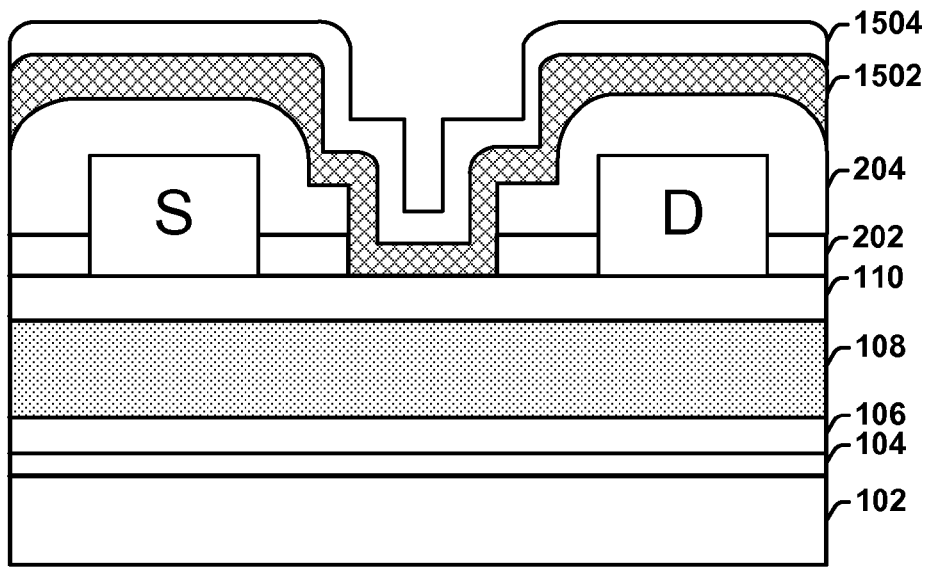

FIG. 15 illustrates a cross-sectional view 1500 of some embodiments of a substrate corresponding to acts 1112-1114. As shown in cross-sectional view 1500, a multi-dielectric layer 1502, comprising any number of pair of dielectric material, is formed over the electron supply layer 110. In some embodiments, the different dielectric materials of the multi-dielectric layer 1502 can be in-situ deposited using a vapor deposition technique, such as atomic layer deposition (ALD), physical vapor deposition (PVD), or chemical vapor deposition (CVD). A gate metal layer 1504 may be formed directly on top of the multi-dielectric layer. The gate metal layer 1504 may be formed by depositing a metal using sputtering or physical vapor deposition, for example.

Figure 16:
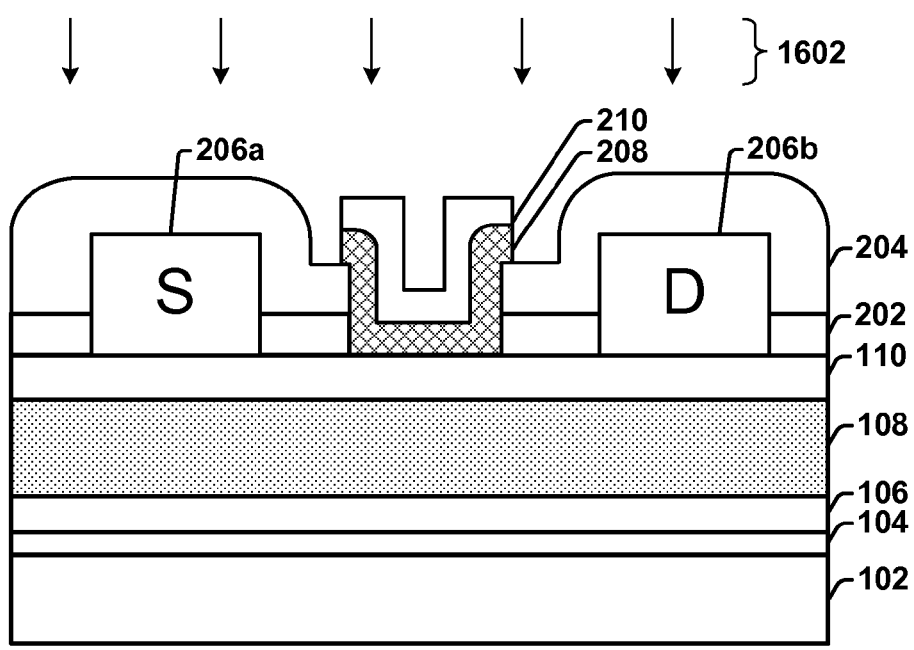

FIG. 16 illustrates a cross-sectional view 1600 of some embodiments of a substrate corresponding to act 1116. As shown in cross-sectional view 1600, the multi-dielectric layer 208 and the gate metal layer (1504) are selectively exposed to an etchant 1602, which removes a part of the multi-dielectric layer 208 and the gate metal layer (1504) to define a metal gate structure 210. In some embodiments, the etchant 1602 may comprise a dry etchant.

It will be appreciated that while reference is made throughout this document to exemplary structures in discussing aspects of methodologies described herein (e.g., the structure presented in FIGS. 5-10, while discussing the methodology set forth in FIG. 4), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein The present disclosure relates to a structure for an MISFET (metal-insulator-semiconductor field-effect transistor) or HEMT (high-electron mobility transistor) device that provides for a high-mobility and low gate leakage.

In some embodiments, the present disclosure relates to a MISFET device. The MISFET device comprises a layer of semiconductor material disposed over a substrate. The MISFET device further comprises an electron supply layer located over the layer of semiconductor material, wherein the electron supply layer and the layer of semiconductor material form a hetero-junction. The MISFET device further comprises a multi-dielectric layer located above the electron supply layer, and comprising two or more stacked dielectric materials sharing an interface having negative fixed charges. The MISFET device further comprises a metal gate structure located on top of the multi-dielectric layer, so that the multi-dielectric layer is disposed between the electron supply layer and the metal gate structure.

In other embodiments, the present disclosure relates to an enhancement mode gallium-nitride (GaN) transistor device. The GaN transistor device comprises a gallium nitride (GaN) layer disposed over a substrate. The GaN transistor device further comprises an aluminum gallium nitride (AlGaN) located over the GaN layer, wherein the AlGaN and the GaN layer form a hetero-junction. The GaN transistor device further comprises a multi-dielectric layer comprising two or more stacked layers of dielectric material located above the AlGaN layer, wherein a lower one of the two or more layers of dielectric material has a larger Gibbs free energy than an overlying one of the two or more layers of dielectric material. The GaN transistor device further comprises a metal gate structure located on top of the multi-dielectric layer, so that the multi-dielectric layer is disposed between the AlGaN layer and the metal gate structure.

In yet other embodiments, the present disclosure relates to a method of forming an enhancement mode MISFET transistor device. The method comprises forming a layer of semiconductor material over a substrate. The method further comprises forming an electron supply layer over the layer of semiconductor material. The method further comprises forming a multi-dielectric layer, comprising two or more stacked dielectric materials sharing an interface having negative fixed charges, above the electron supply layer. The method further comprises forming a metal gate structure on top of the multi-dielectric layer, so that the multi-dielectric layer is disposed between the electron supply layer and the metal gate structure.

What is claimed is:

1. A MISFET transistor device, comprising:
a layer of semiconductor material disposed over a substrate;
an electron supply layer located over the layer of semiconductor material, wherein the electron supply layer and the layer of semiconductor material form a hetero-junction;
a multi-dielectric layer comprising a plurality of stacked dielectric materials stacked in a repeating pattern over a top surface of the electron supply layer; and
a metal gate structure located on top of the multi-dielectric layer at a location laterally between a source region and a drain region, so that the multi-dielectric layer is disposed between the electron supply layer and the metal gate structure,
wherein the multi-dielectric layer is vertically disposed between the electron supply layer and the metal gate structure and laterally separated from the source region and the drain region.

2. The transistor device of claim 1, wherein the plurality of stacked dielectric materials comprise metal-oxide compounds, respectively having a metal and an oxide.

3. The transistor device of claim 2, wherein the multi-dielectric layer comprises a plurality of pair of stacked dielectric materials respectively comprising alternating layers of silicon dioxide ($SiO_2$) and aluminum oxide ($Al_2O_3$).

4. The transistor device of claim 1, wherein the plurality of stacked dielectric materials comprise metal fluoride compounds, respectively having a metal and a fluoride.

5. The transistor device of claim 1, wherein the plurality of stacked dielectric materials respectively have thicknesses in a range of between approximately 5 angstrom and approximately 200 angstrom.

6. The transistor device of claim 1,
wherein the multi-dielectric layer comprises a U shaped structure having a cavity comprising sidewalls and a substantially flat bottom surfaces; and
wherein the metal gate structure is disposed within the cavity and comprises a U shaped structure with a recess extending into an upper surface of the metal gate structure.

7. The transistor device of claim 6, wherein the multi-dielectric layer and the metal gate structure are laterally disposed between sections of a capping layer that respectively abuts the source region and the drain region.

8. An enhancement mode gallium-nitride transistor device, comprising:
a gallium nitride (GaN) layer disposed over a substrate;
an aluminum gallium nitride (AlGaN) layer located over the GaN layer, wherein the AlGaN layer and the GaN layer form a hetero-junction;
a multi-dielectric layer comprising a plurality of stacked layers of dielectric materials stacked in a repeating pattern and located above a top surface of the AlGaN layer, wherein the multi-dielectric layer comprises a 'U' shaped structure; and
a metal gate structure disposed onto the multi-dielectric layer and having a 'U' shape with a recess extending into an upper surface of the metal gate structure, wherein the multi-dielectric layer is vertically disposed between the AlGaN layer and the metal gate structure and laterally separated from a source region and a drain region.

9. The transistor device of claim 8, wherein the plurality of stacked layers of dielectric materials comprise metal-oxide compounds, respectively having a metal and an oxide.

10. The transistor device of claim 8, wherein the plurality of stacked layers of dielectric materials comprise metal-nitride compounds, respectively having a metal and a nitride, or metal fluoride compounds, respectively having a metal and a fluoride.

11. The transistor device of claim 8, wherein the plurality of stacked layers of dielectric materials respectively have thicknesses in a range of between approximately 5 angstrom and approximately 200 angstrom.

12. The transistor device of claim 1, wherein the metal gate structure extends from a first position laterally disposed between interior sidewalls of the multi-dielectric layer to second position overlying the multi-dielectric layer.

13. The transistor device of claim 7, further comprising:
a passivation layer laterally disposed between the multi-dielectric layer and the source region and the drain region, and vertically disposed between the electron supply layer and the capping layer.

14. A transistor device, comprising:
a layer of semiconductor material disposed over a substrate;
an electron supply layer located over the layer of semiconductor material;
a multi-dielectric layer located above a top surface of the electron supply layer, wherein the multi-dielectric layer comprises a plurality of stacked layers of different metal-oxide compounds, metal-nitride compounds, or metal fluoride compounds, which are stacked in a repeating pattern;

a metal gate structure located on top of the multi-dielectric layer;

a passivation layer laterally surrounding a source region and a drain region, and vertically contacting an upper surface of the electron supply layer, wherein the passivation layer is arranged between the multi-dielectric layer and the source region and the drain region; and wherein the multi-dielectric layer is vertically disposed between the electron supply layer and the metal gate structure and laterally separated from the source region and the drain region.

15. The transistor device of claim 14, wherein the layer of semiconductor material comprises a gallium nitride (GaN) layer disposed over the substrate; and wherein the electron supply layer comprises an aluminum gallium nitride (AlGaN) layer located on and in direct contact with the GaN layer.

16. The transistor device of claim 14, wherein the source region and the drain region are located over the electron supply layer and respectively have bottom surfaces that are substantially vertically aligned with a bottom surface of the multi-dielectric layer at a location underlying the metal gate structure.

17. The transistor device of claim 16, further comprising:

a capping layer laterally separating the multi-dielectric layer from the source region and the drain region, and vertically overlying the passivation layer, the source region, and the drain region.

18. The transistor device of claim 14, wherein the metal gate structure extends from a first position laterally disposed between interior sidewalls of the multi-dielectric layer to second position overlying the multi-dielectric layer, and wherein the metal gate structure has a depression within an upper surface of the metal gate structure that vertically extends to a location that is between the interior sidewalls of the multi-dielectric layer.

19. The transistor device of claim 1, further comprising:

a passivation layer laterally surrounding the source region and the drain region, and vertically contacting the electron supply layer and that is laterally arranged between the multi-dielectric layer and the source region and the drain region.

20. The transistor device of claim 1, wherein the metal gate structure has a first lateral surface arranged within a depression within the multi-dielectric layer and a second lateral surface facing an upper surface of the multi-dielectric layer.

* * * * *